(12) United States Patent
Gopalakrishna et al.

(10) Patent No.: US 10,631,432 B2
(45) Date of Patent: Apr. 21, 2020

(54) DYNAMIC AIR INTAKE CONTROL ASSEMBLY

(71) Applicant: Seagate Technology LLC, Cupertino, CA (US)

(72) Inventors: Shankar Gopalakrishna, Bangalore (IN); Anil Koyad Choyikkunnil, Bangalore (IN); Yogeesha Manjunathaiah, Bangalore (IN); Saju Cheeran Verghese Francis, Bangalore (IN); Y. Suresh Reddy, Bangalore (IN)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/911,353

(22) Filed: Mar. 5, 2018

(65) Prior Publication Data

US 2019/0274231 A1  Sep. 5, 2019

(51) Int. Cl.
 *H05K 7/20* (2006.01)
 *F24F 13/14* (2006.01)
 *F24F 13/24* (2006.01)
(52) U.S. Cl.
 CPC ......... *H05K 7/20181* (2013.01); *F24F 13/14* (2013.01); *F24F 13/24* (2013.01); *H05K 7/20145* (2013.01); *H05K 7/20736* (2013.01); *F24F 2013/242* (2013.01)
(58) Field of Classification Search
 CPC .......... H05K 7/20181; H05K 7/20145; H05K 7/20736; F24F 13/14; F24F 13/24; F24F 2013/242

USPC ..................................................... 361/679.51
See application file for complete search history.

(56) References Cited

U.S. PATENT DOCUMENTS

| | | | |
|---|---|---|---|
| 4,445,426 A * | 5/1984 | Bohanon, Sr. .......... | F24F 7/013 454/351 |
| 5,596,483 A | 1/1997 | Wyler | |
| 6,146,565 A | 11/2000 | Keller | |
| 6,313,990 B1 | 11/2001 | Cheon | |
| 6,481,527 B1 * | 11/2002 | French ................... | G10K 11/16 181/198 |
| 6,493,221 B2 | 12/2002 | Harrison et al. | |
| 6,601,054 B1 | 7/2003 | Lo et al. | |
| 6,646,876 B2 | 11/2003 | Carr et al. | |
| 6,674,609 B2 | 1/2004 | Boutaghou | |
| 6,775,136 B2 | 8/2004 | Tozune et al. | |
| 6,896,612 B1 * | 5/2005 | Novotny ............ | H05K 7/20618 361/691 |
| 7,031,154 B2 * | 4/2006 | Bash ................... | H05K 7/20718 165/80.3 |
| 7,139,401 B2 | 11/2006 | Culman et al. | |
| 7,152,418 B2 * | 12/2006 | Alappat ............. | H05K 7/20563 62/186 |
| 7,215,552 B2 * | 5/2007 | Shipley .............. | H05K 7/20563 165/104.33 |
| 7,236,361 B2 * | 6/2007 | Cote .................... | G11B 33/127 165/80.3 |

(Continued)

*Primary Examiner* — Anatoly Vortman
(74) *Attorney, Agent, or Firm* — Hall Estill Attorneys at Law

(57) ABSTRACT

An air intake control system can consist of an aero-acoustic assembly positioned within an enclosure. The aero-acoustic assembly may have an intake occupied by a plurality of louvers with each of the plurality of louvers configured to move between open and closed positions in response to airflow passing through the intake.

18 Claims, 5 Drawing Sheets

(56) References Cited

U.S. PATENT DOCUMENTS

| | | | |
|---|---|---|---|
| 7,310,737 B2 * | 12/2007 | Patel | G06F 1/20 713/300 |
| 7,353,908 B1 * | 4/2008 | French | G10K 11/178 181/206 |
| 7,372,654 B2 | 5/2008 | Fujie et al. | |
| 7,382,632 B2 | 6/2008 | Alo et al. | |
| 7,535,707 B2 | 5/2009 | Seibold | |
| 7,646,603 B2 * | 1/2010 | Bard | H05K 7/20181 165/104.33 |
| 7,707,711 B2 * | 5/2010 | Bartell | H05K 7/20736 181/200 |
| 7,712,576 B2 * | 5/2010 | Goto | G06F 1/182 181/200 |
| 7,872,865 B2 * | 1/2011 | Matsushima | G11B 33/142 165/104.33 |
| 7,876,557 B2 * | 1/2011 | Suzuki | G06F 1/20 361/679.46 |
| 7,903,403 B2 * | 3/2011 | Doll | H05K 7/20736 361/679.48 |
| 8,081,444 B2 | 12/2011 | Xiao et al. | |
| 8,091,682 B2 * | 1/2012 | Yamauchi | H05K 7/20172 181/224 |
| 8,165,311 B2 | 4/2012 | Rodrigues et al. | |
| 8,320,121 B2 * | 11/2012 | Bisson | H05K 7/20736 361/679.5 |
| 8,373,987 B2 * | 2/2013 | Kang | G06F 1/20 361/695 |
| 8,472,183 B1 * | 6/2013 | Ross | H05K 7/20736 361/679.48 |
| 8,701,821 B2 * | 4/2014 | O'Coimin | H05K 7/20736 181/224 |
| 8,855,329 B2 | 10/2014 | Slapak et al. | |
| 9,894,807 B2 * | 2/2018 | Bard | H05K 7/20181 |
| 2003/0183446 A1 * | 10/2003 | Shah | F01P 5/06 181/205 |
| 2005/0237717 A1 | 10/2005 | Babb et al. | |
| 2005/0241810 A1 * | 11/2005 | Malone | H05K 7/20727 165/122 |
| 2006/0054380 A1 * | 3/2006 | Doll | E04F 17/04 181/225 |
| 2007/0030650 A1 * | 2/2007 | Madara | H05K 7/20572 361/695 |
| 2009/0268391 A1 * | 10/2009 | Matsushima | G11B 33/142 361/679.49 |
| 2010/0290182 A1 | 11/2010 | Baitz et al. | |
| 2013/0055748 A1 * | 3/2013 | Mahajan | F04D 25/14 62/262 |
| 2015/0109733 A1 * | 4/2015 | Horiuchi | H05K 7/20136 361/695 |
| 2017/0184334 A1 * | 6/2017 | Boehringer | F25D 23/003 |
| 2018/0077819 A1 * | 3/2018 | Roy | H05K 7/20181 |

* cited by examiner

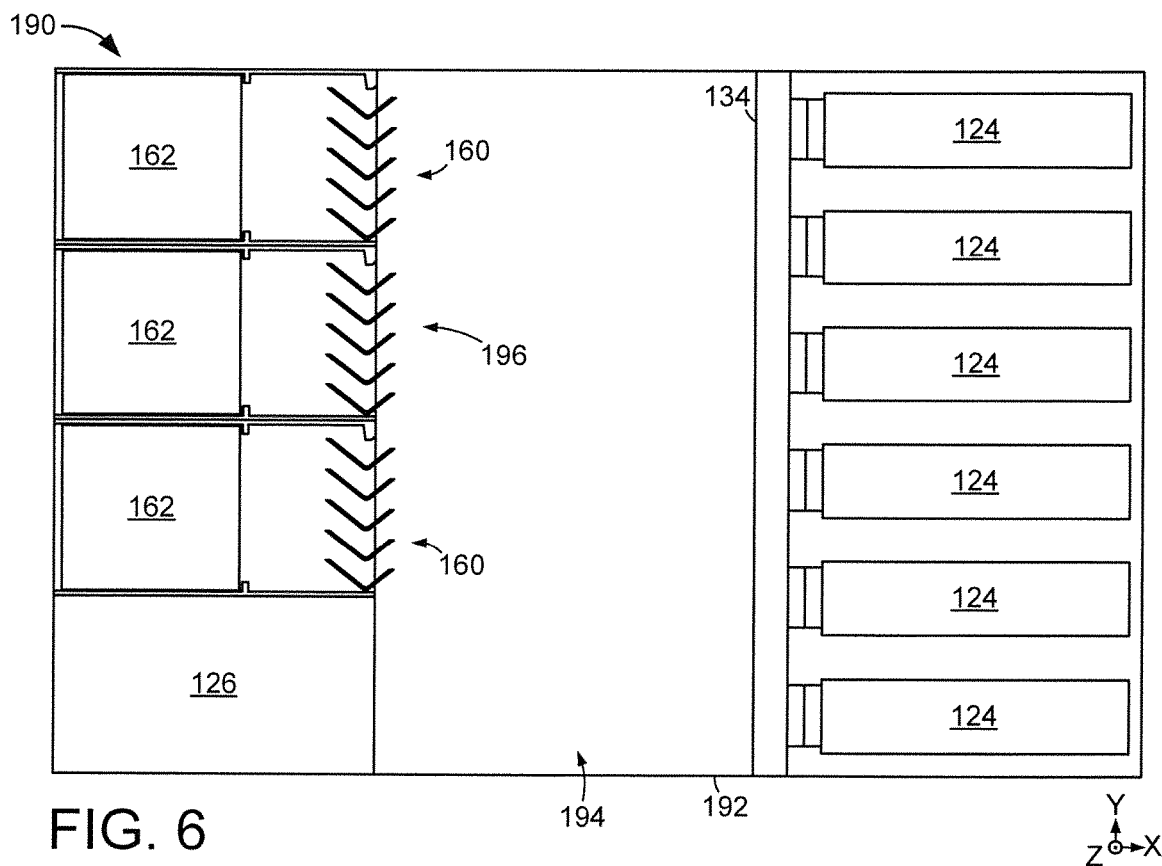
FIG. 6
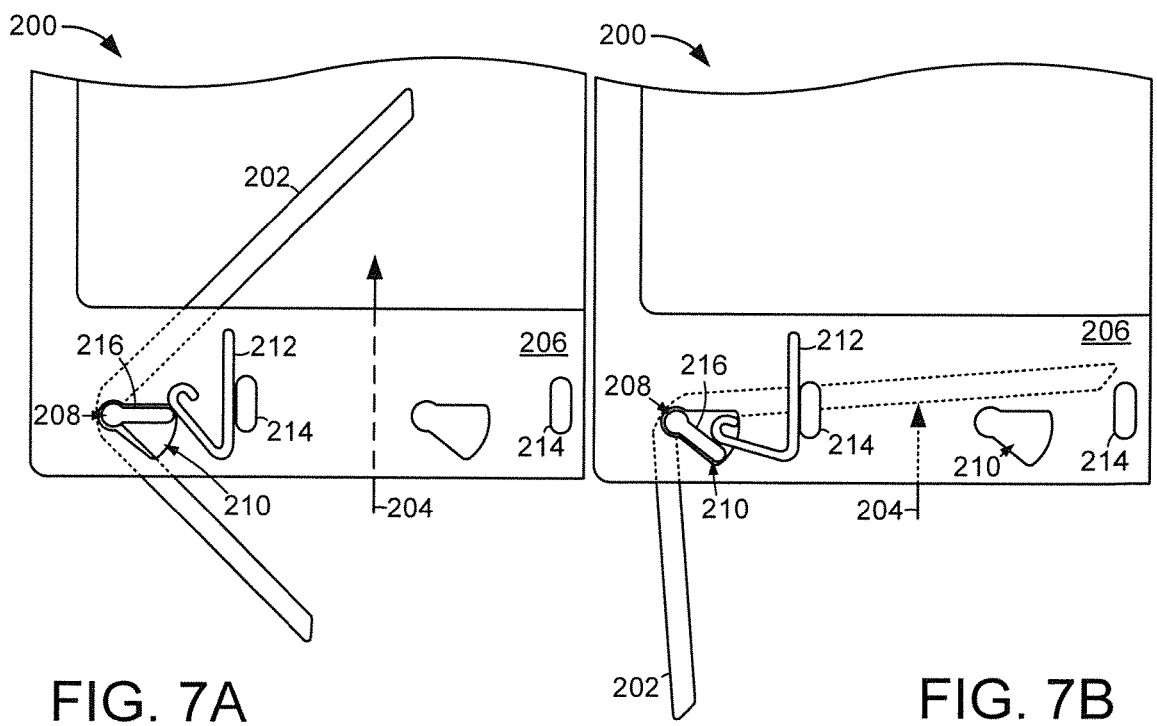
FIG. 7A
FIG. 7B

DYNAMIC AIR INTAKE CONTROL ASSEMBLY

SUMMARY

An air intake control system, in accordance with assorted embodiments, has an aero-acoustic assembly positioned within an enclosure. The aero-acoustic assembly has an intake occupied by a plurality of louvers with each of the plurality of louvers configured to move between open and closed positions in response to airflow passing through the intake.

In other embodiments, a data storage system has a baffle assembly and data storage device that are each mounted within a data storage enclosure. The baffle assembly has an intake occupied by a plurality of louvers with each of the plurality of louvers contacting a pressure feature and configured to move between open and closed positions in response to airflow passing through the intake.

A data storage system can be operated, in some embodiments, by positioning an aero-acoustic assembly and data storage device each within a data storage enclosure prior to activating an air moving mechanism of the aero-acoustic assembly. In response to airflow induced by the air moving mechanism, a plurality of louvers of the aero-acoustic assembly move into an open position with the plurality of louvers occupying an intake of the aero-acoustic assembly. Degraded performance of the air moving mechanism reduces airflow through the intake and causes the plurality of louvers to move into a closed position to block airflow through the intake.

BRIEF DESCRIPTION OF THE DRAWINGS

FIG. 6 provides an example data storage enclosure configured in accordance with various embodiments.

FIGS. 7A-7C respectively display portions of an example aero-acoustic assembly constructed and operated in accordance with some embodiments.

DETAILED DESCRIPTION

The present disclosure generally relates to an aero-acoustic assembly that can optimize the performance in an air intake, such as, but not limited to, in an enclosure housing one or more data storage devices as part of a data storage system.

The evolution of data storage devices to greater data storage capacities and faster data access latency has resulted in tighter structural and operational tolerances. As such, a data storage device can be more susceptible to vibrations across a larger frequency range than past devices that did not have such tight tolerances. The packaging of multiple data storage devices together has emphasized the removal of heat via convection. However, moving air can create acoustic noise and/or vibrations that can degrade the performance of a data storage device. Hence, there exists a goal to mitigate the acoustic effects of moving air on data storage devices, particularly data storage systems employing multiple packaged data storage devices.

Accordingly, various embodiments configure an aero-acoustic assembly to reduce the generation of acoustic noise and vibrations along with minimize the effects of such acoustic components on data storage devices. An aero-acoustic assembly can automatically react to moving air, or the lack of moving air, to prevent acoustic noise and vibrations from generating and/or reaching data storage devices. The ability to tune the structure and operation of an aero-acoustic assembly allows data storage devices to deliver optimized performance through operation with tight tolerances.

Figure 1:
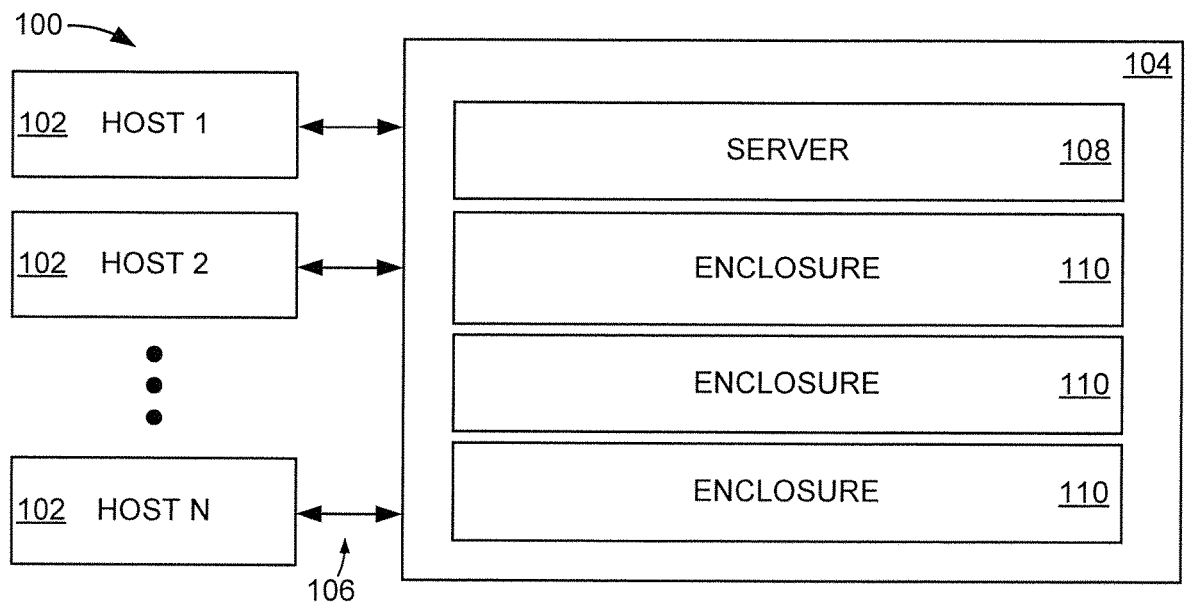
FIG. 1 displays an example data storage system that may be employed in accordance with various embodiments.

FIG. 1 displays a block representation of an example data storage system 100 in which various embodiments can be practiced. The data storage system 100 can provide data storage and access to any number of remote hosts 102 connected to one or more data storage racks 104 via a wired and/or wireless network 106. The example data storage rack 104 of FIG. 1 has a local server 108 that directs data transfers and maintenance to, and from, the assorted data storage enclosures 110 resident in the rack 104. The respective enclosures 110 can operate individually, and concurrently, as directed by the server 110, and may have similar, or dissimilar, data storage capabilities, such as data capacity, transfer speed, latency, and error rate.

Figure 2:
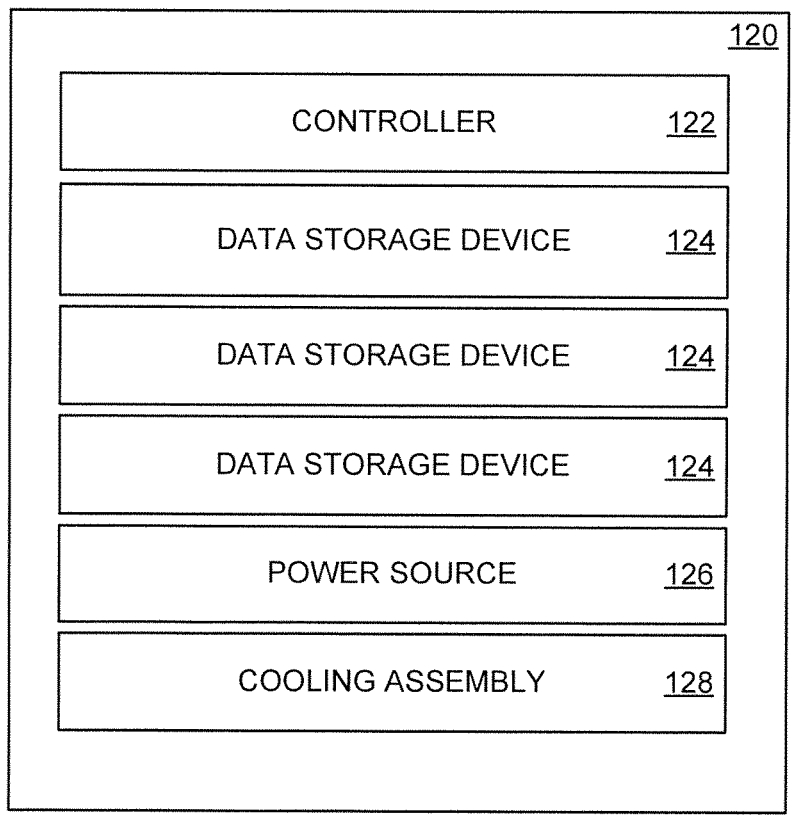
FIG. 2 represents an example data storage enclosure that may be utilized in the data storage system of FIG. 1.

FIG. 2 conveys a block representation of an example data storage enclosure 120 that may be employed in the data storage system 100 of FIG. 1. A data storage enclosure 120 can have a local controller 122 that operates in independently, and in concert with a rack server 108, to service data access requests from one or more hosts 102. The local controller 122 can schedule and execute data writes and data reads from one or more data storage devices 124 housed in the enclosure 120. The respective data storage devices 124 can receive electrical power from one or more power sources 126 resident in the enclosure 120.

The use of power by the data storage devices 124 generates heat that can degrade data access performance along with data storage device reliability. Thus, at least one cooling assembly 128 can be positioned within the enclosure 120 to remove heat generated by the data storage devices 124. It is noted that the various components shown in FIG. 2 are to be housed in a single package that can be installed, and removed, from a system rack 104 as a single unit. In yet, the data storage devices 124 may be individually removed, installed, and replaced, which allows for swapping of data storage devices 124 due to poor performance or minimal available capacity.

Figure 3:
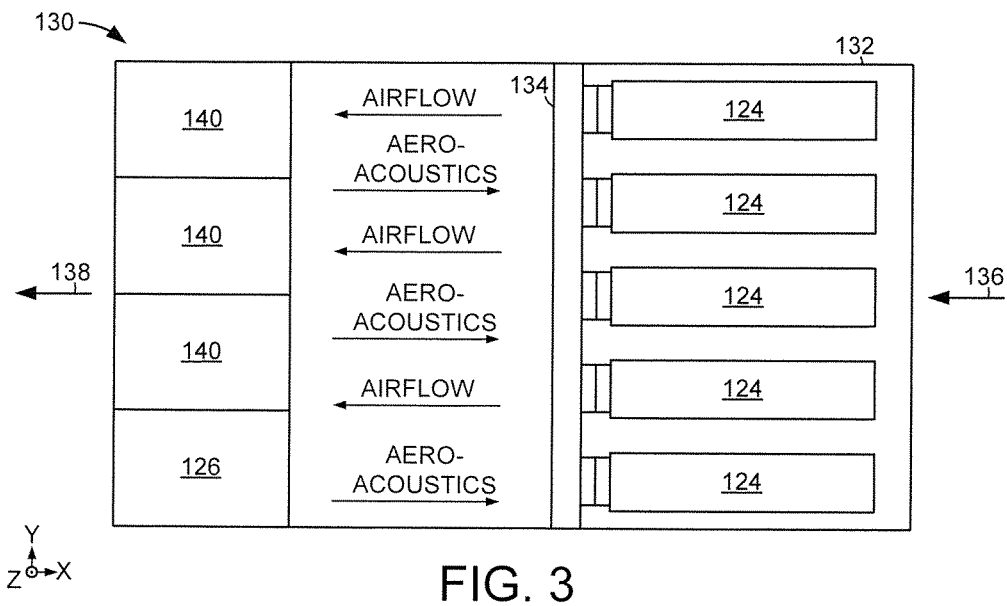
FIG. 3 depicts a line representation of an example data storage enclosure arranged in accordance with some embodiments.

FIG. 3 depicts a line representation of an example data storage enclosure 130 where an aero-acoustic assembly can be employed in accordance with some embodiments. The data storage enclosure 130 can have a single housing 132 in which a plurality of data storage devices 124 are physically mounted and electrically connected to a common midplane 134. While not required, the midplane 134 can provide structural support for enclosure circuitry, such as a controller 122, cache memory, and buses, that allow for efficient operation of the data storage devices 124 as part of a distributed data network. The data storage devices 124 can be arranged to efficiently allow air, or other cooling fluid, to pass from an inlet side 136 of the housing 132 to an outlet side 138. Such air movement can be facilitated, and/or aided, by one or more fans 140 that collectively operate as a cooling assembly 128. During operation, the fans 140 can generate acoustic noise in the form of frequencies that induce vibrations in the housing 132, midplane 134, and/or data storage devices 124, which can be characterized as aero-acoustics. Such acoustic noise travels opposite the direction of airflow. Hence, the pulling of air through the enclosure 130 by the fans 140 results in acoustic noise being experienced by the assorted data storage devices 124, which degrades data storage performance and reliability over time.

Figure 4:
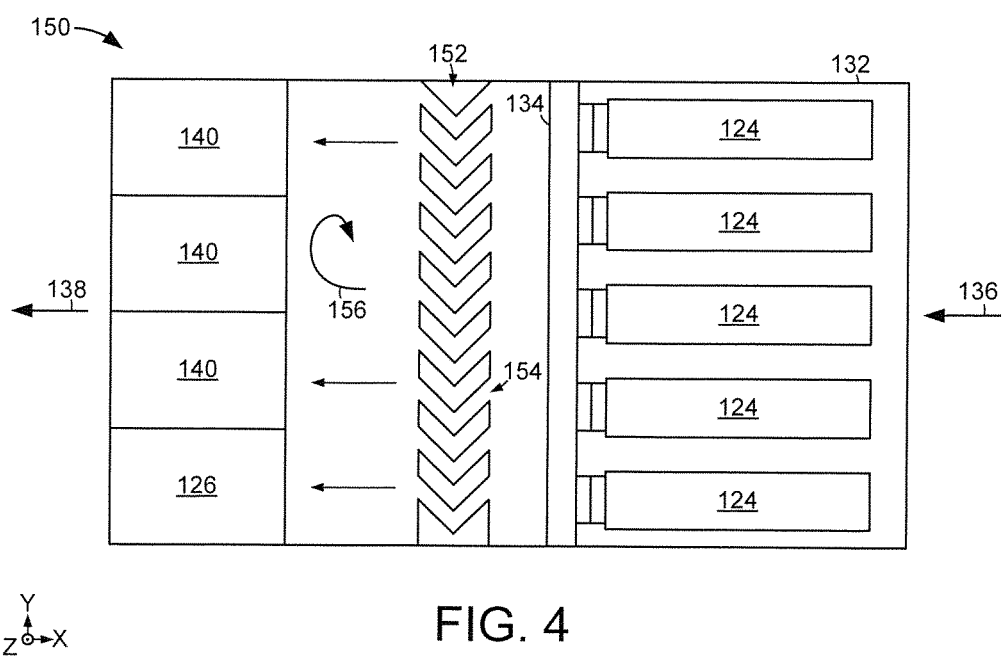
FIG. 4 conveys a line representation of an example data storage enclosure configured in accordance with various embodiments.

FIG. 4 illustrates an example data storage enclosure 150 in which an acoustic baffle 152 is utilized to mitigate acoustic noise from reaching the data storage devices 124. While any baffle 152 configuration can be employed, the use of angled channels 154 can disrupt the passage of acoustic noise and allow the respective data storage devices 124 to operate at full performance.

However, error or failure of a fan 140 can lead to back pressure, vacuum, and turbulence, as represented by arrow 156, that can lead to fan 140 and data storage device 124 failures. For instance, a failed fan 140 can cause air to be re-circulated around the failed fan 140, which restricts laminar flow and efficient operation of the remaining fan(s) 140. Such airflow restriction can result in cascading fan 140 failures, or reduced fan 140 performance, and increasing enclosure temperatures that degrade data storage performance. Although it is contemplated that fan 140 placement within the housing 152 can be customized to reduce the generation of back pressure and airflow turbulence 156, any turbulence 156 can result in higher frequency acoustic noise that is not easily mitigated by acoustic baffle 152 configurations, particularly in data storage devices operating in inert gas environments, such as Helium.

It is noted that when one or more acoustic baffles 152 are employed, small gaps, slits, and openings can allow acoustic noise to reach the data storage devices 124, which makes complete sealing of high frequency acoustic noise difficult. Accordingly, various embodiments are directed to acoustic noise attenuating configurations that mitigate the travel of acoustic noise to the data storage devices 124 and reduce the generation of back pressure and turbulence in the event of fan 140 fluctuation and/or failure.

Figure 5A:
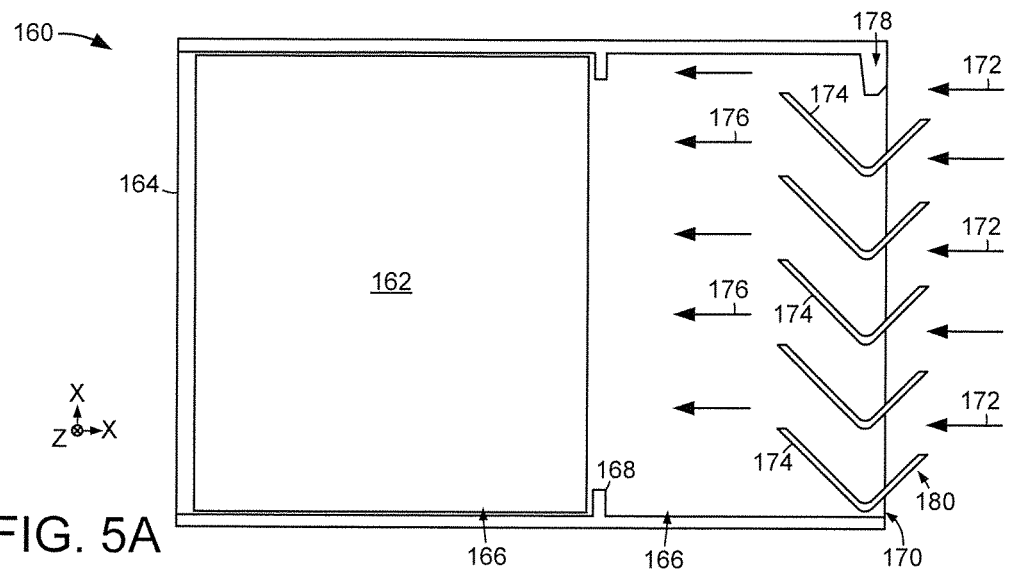
FIGS. 5A & 5B respectively show an example aero-acoustic assembly that may be employed in the data storage enclosures of FIGS. 1-4.
Figure 5B:
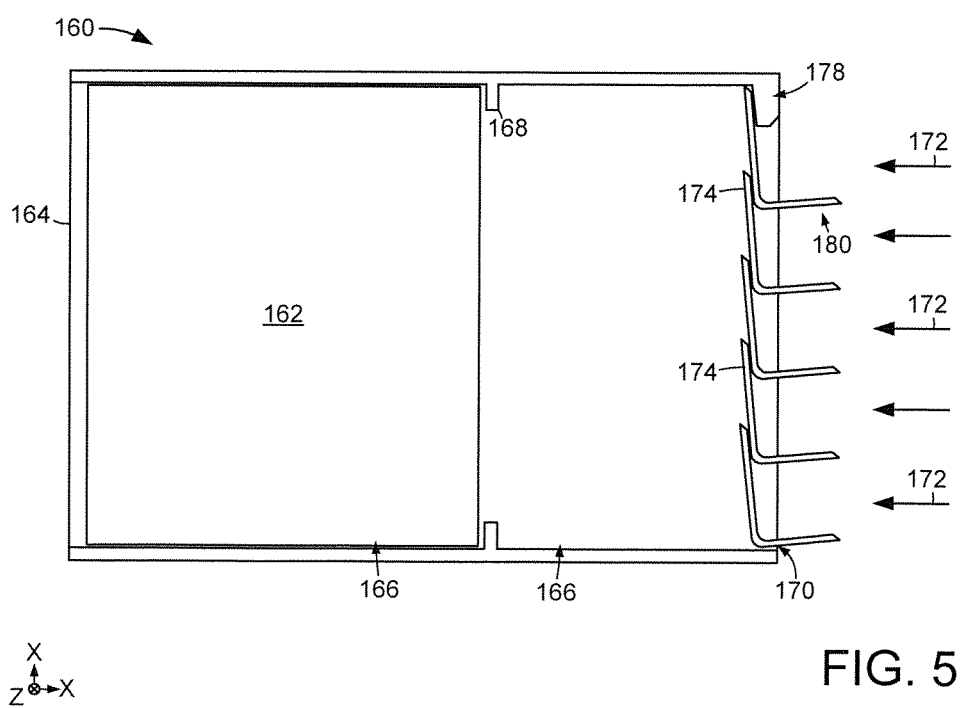

FIGS. 5A and 5B respectively convey line representations of an example aero-acoustic assembly 160 constructed and operated in accordance with various embodiments to optimize data storage performance of at least a data storage enclosure. The aero-acoustic assembly 160 consists of an air moving mechanism 162 positioned within a housing 164. As shown, the housing 164 can be segmented into interior compartments 166 by tabs 168, which can secure the air moving mechanism 162 in-place despite force being applied by moving air.

The housing 164 can have one or more intakes 170 that receive hot air, as represented by solid arrows 172. The intake(s) 170 can be occupied by at least one louver 174 that can tilt, rotate, and move to selectively open and close an intake 170. An open intake configuration is displayed in FIG. 5A with multiple louvers 174 collectively allowing hot air into the housing, as represented by arrows 176. The air 176 is then forced out of the housing 164 by the air moving mechanism 162, which draws more hot air 172 through the intake 170.

It is contemplated that pressure created by the air moving mechanism 162 opens the respective louvers 174 to allow hot air 172 to enter, which can correspond with the louvers 174 being characterized as flaps. Conversely, an inactive air moving mechanism 162 can cause the louvers 174 to rotate, tilt, and move into a closed position, as shown in FIG. 5B. The closed louver position prevents hot air 172 from entering the housing 164 and disrupting laminar flow of air outside the housing 164. That is, if the louvers 174 remained open while the air moving mechanism 162 is inactive, hot air 172 could flow into the housing 164 and create turbulence 156 for other air outside the housing 164. Hence, various embodiments configure the louvers 174 to automatically close in response to the air moving mechanism 162 turning off.

It is noted that the closed louver position of FIG. 5B corresponds with the intake 170 being blocked and the respective louvers 174 physically contacting one another. The housing 164 can be configured with a keystone portion 178 that stops rotation and movement of at least one louver 174. In some embodiments, at least one louver 174 is arranged with an exterior protrusion 180 that reduces air turbulence and the development of back pressure proximal the intake 170 while the louvers 174 are open or closed. In other words, the protrusions of the respective louvers 174 can have a shape and size that reduces air turbulence while promoting laminar airflow through the intake 170 when open, as in FIG. 5A, and in front of the intake 170 when the closed, as in FIG. 5B.

The louver 174 arrangement that promotes laminar airflow may be particularly useful when multiple aero-acoustic assemblies are concurrently positioned within a single data storage enclosure, as generally illustrated by the example enclosure 190 of FIG. 6. The enclosure 190 has a single housing 192 in which a plurality of data storage devices 124 are positioned. The data storage devices 124 are each electrically coupled to a midplane 134 that enables data storage and maintenance operations to be carried out. The enclosure 190 contains at least one power source 126 and multiple aero-acoustic assemblies 160 that can operate collectively to evacuate hot air from the housing 192.

Each aero-acoustic assembly 160 has multiple separate louvers 174 that automatically, or manually, move between open and closed positions relative to the assembly housing 164. In the event an air moving mechanism 162 has an error, or fails, the louvers 174 of the assembly 160 can automatically move to a closed position to prevent the generation, or maintenance, of back pressure, turbulence, and aero-acoustics in the hot air region 194 of the housing 192. It is contemplated that the louvers 174 of different aero-acoustic assemblies 160 can be configured differently depending on the position of the assembly 160 within the housing 192. For instance, a middle aero-acoustic assembly 196 can have differently configured protrusions 180 than the other assemblies 160 in order to optimize airflow in the hot air region 194 during assembly 196 inactivity.

Figure 7C:
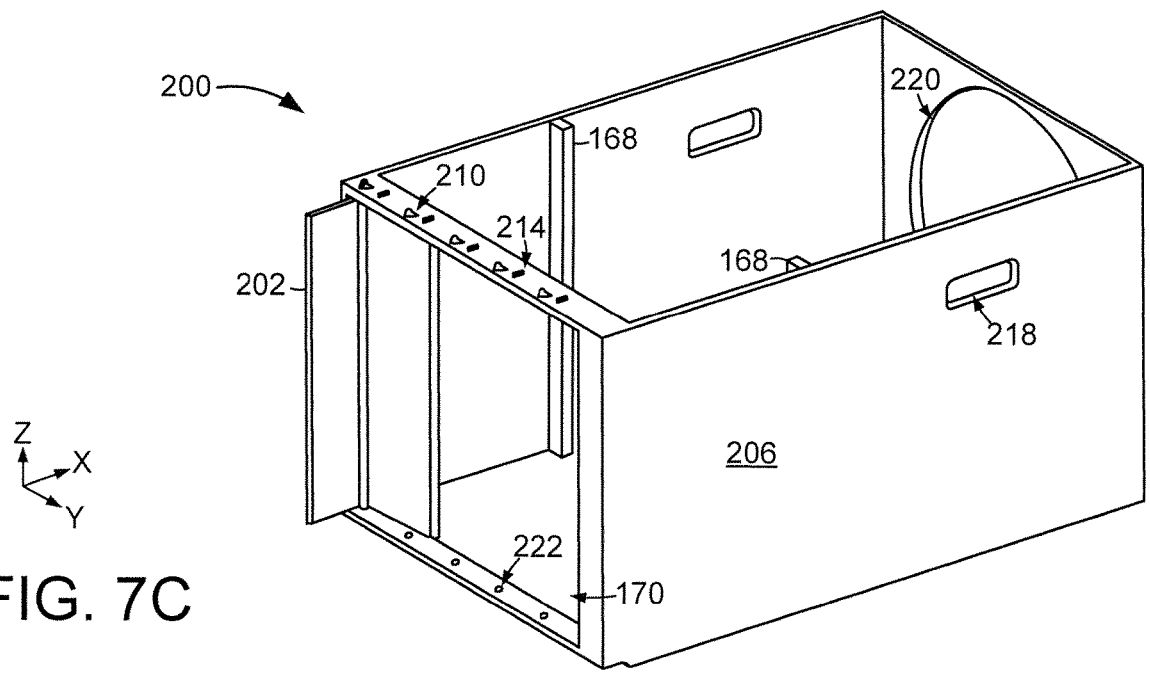

FIGS. 7A-7C respectively illustrate portions of an example aero-acoustic assembly 200 that can be utilized in the data storage enclosures of FIGS. 1 & 6 in accordance with some embodiments. FIG. 7A depicts a line representation of a louver 202 in an open position that allows hot air 204 to enter into the housing 206 where an air moving mechanism is mounted. A key portion 208 of the louver 202 occupies an opening 210 in the housing 206 that restricts movement of the louver 202 outside of a predetermined angular range, as conveyed by the open louver position of FIG. 7A compared to the closed louver position of FIG. 7B.

The louver key portion 208 can be engaged by one or more pressure features 212, which may be a mechanical spring, magnet, or elastic member that imposes continual pressure on the key portion 208. A pressure feature 212 can mount to a pressure tab 214 of the housing 206 to provide a stable platform from which the pressure feature 212 can engage to impose pressure on the key portion 208. The pressure feature 212 may have any shape and size, but in some embodiments is configured to apply pressure onto a flat surface 216 of the key portion 208 so that the louver 202 is continuously forced toward the closed position shown in FIG. 7B.

Although the utilization of a pressure feature 212 is not required, the continuous force applied by a pressure feature 212 ensures the louver 202 is in a closed position when the airflow through the housing intake 170 is insufficient to overcome the force applied by the pressure feature 212. For instance, if the air moving mechanism of the aero-acoustic assembly 200 has decreased performance, or overall failure, the louvers 202 of the assembly 200 would nearly immediately move to a closed position.

However, it is contemplated that less than all the louvers 202 of an aero-acoustic assembly 200 is engaged by a pressure feature 212, which would allow a louver 202 to freely move between open and closed positions as dictated by airflow. That is, some or all of the louvers 202 of an aero-acoustic assembly 200 may not be engaged by a pressure feature 212 and, as a result, can more naturally react to changes in airflow pressure and volume through the intake 170. In such a case, the louver 202 can be weighted so that the center of weight and/or gravity is located outside of the housing 206, towards the louver protrusion 180, to naturally induce the louver 202 to close during instances of reduced airflow pressure and/or volume.

FIG. 7C displays an isometric view line representation of a partially constructed aero-acoustic assembly 200. The housing 206 has several mounting apertures 218 to secure an air moving mechanism in relation to an exhaust port 220. The housing 206 has a plurality of pivot apertures 222 on an opposite side of the intake 170 from the key opening 210. The pivot apertures 222 may provide a rotational axis for a louver 202 without restricting movement of the key portion 208 within the key opening 210. The inclusion of additional louvers 202 can practically seal the intake 170 from appreciable airflow into the hot air region 194 when the louvers 202 are in the closed position or practically unveil the intake 170 to allow laminar airflow into the hot air region 194 when the louvers 202 are in the open position.

It is noted that the pivot aperture 222, key opening 210, key portion 208, housing keystone, and louvers 202 can be partially, or completely padded with a vibration absorbent material, such as rubber, fabric, gel, or plastic, that reduces, or eliminates, the generation of vibration and other noise when the louvers 202 move between open and closed positions. For example, aspects of the key opening 210 and/or key portion 208 can be padded to minimize aero-acoustics when the louver 202 changes from a closed position to an open position, and vice-versa. In another non-limiting example, less than all of the louver 202 can be padded where an adjacent louver 202 makes physical contact when the collective louvers 202 are in the closed position. The ability to customize the housing 206 and louvers 202 to reduce the generation of aero-acoustics complements the capability of the louvers 202 to move in response to airflow into the housing 206.

Figure 8:
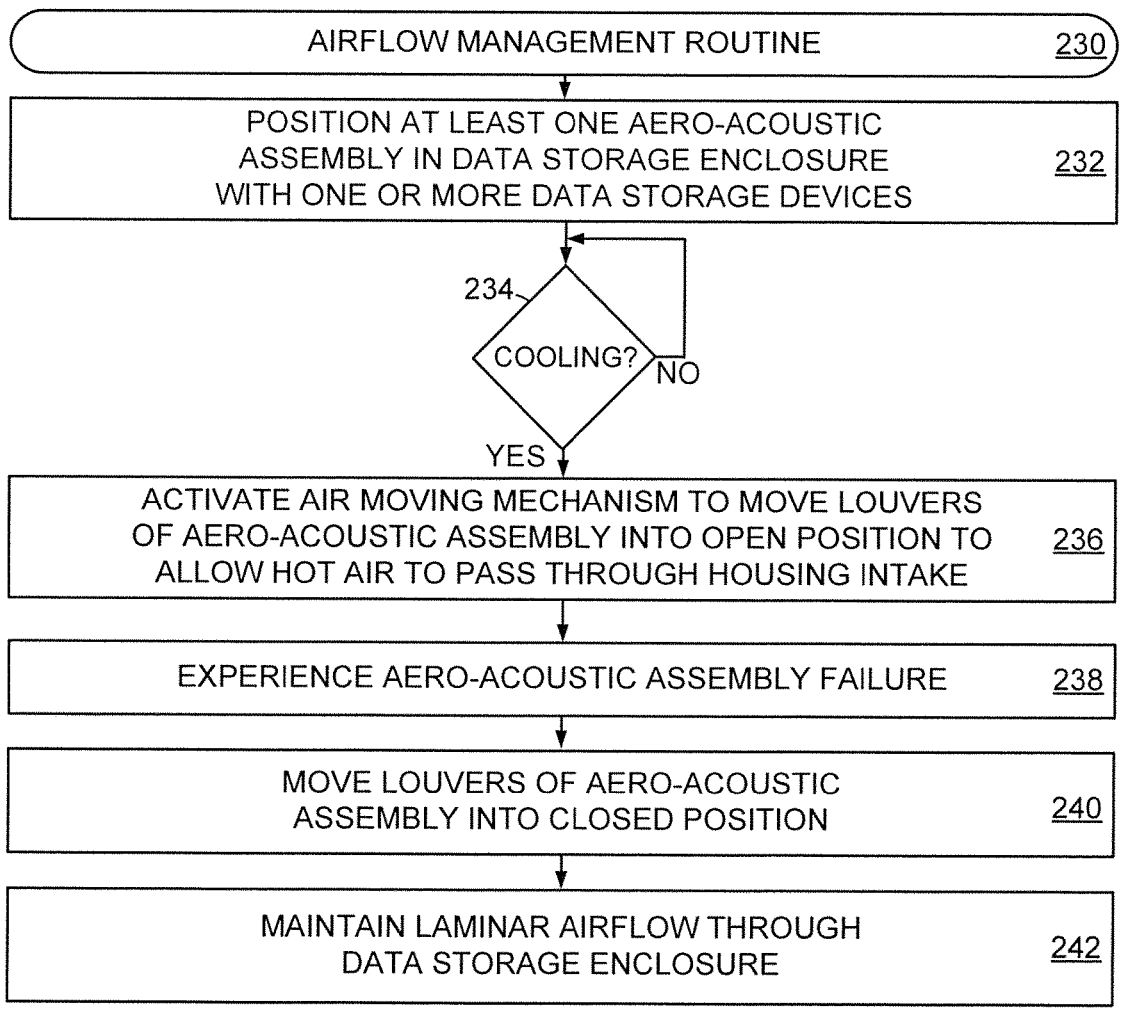
FIG. 8 is an example airflow management routine that can be carried out with the various embodiments of FIGS. 1-7C.

FIG. 8 provides an airflow management routine 230 that can be carried out by a data storage enclosure with the assorted embodiments of FIGS. 2-7C. The routine 230 begins with the construction of a data storage enclosure in step 232 with at least one aero-acoustic assembly mounted in a housing with one or more data storage devices. Decision 234 determines if an aero-acoustic assembly is to be activated due to the heat accumulated in an enclosure, such as enclosure 190 of FIG. 6. If cooling is called for in decision 234, step 236 is triggered where an air moving mechanism of an aero-acoustic assembly is activated, which induces louvers of the aero-acoustic assembly to move into an open position. The open louver position allows hot air to pass from the data storage devices into the aero-acoustic assembly housing through the housing intake.

If heat has not reached a level that induces decision 234 to initiate cooling, routine 230 returns to decision 234 so that heat is continuously monitored for the enclosure. It is noted that routine 230 may remain at step 236 for an extended amount of time while the air moving mechanism efficiently evacuates hot air from the data storage devices of the data storage enclosure. The shape of the louvers in the open position allows for efficient airflow through the aero-acoustic assembly while isolating acoustic noise generated by the air moving mechanism. That is, the curved, substantially L-shaped, louver effectively breaks up acoustic noise moving towards the data storage devices while allowing airflow to flow towards the air moving mechanism.

However, it is contemplated that the air moving mechanism of an aero-acoustic assembly experiences an error and/or failure in step 238 that reduces the volume and/or pressure of airflow passing through the aero-acoustic assembly housing intake. The reduced performance of the air moving mechanism triggers step 240 to move the louvers of the aero-acoustic assembly to a closed position where airflow is effectively prevented through the housing intake. The louver movement of step 240 may be aided by a pressure feature, but such operation is not required.

The closed position of the aero-acoustic assembly louvers prevents the generation of back pressure, noise, and aero-acoustics that could degrade data storage device performance. In addition, the closed louver position allows laminar data storage enclosure airflow to be maintained via the full performance of other air moving mechanisms and aero-acoustic assemblies positioned in the data storage enclosure. In some embodiments, the laminar airflow, and prevention of turbulence in the data storage enclosure, can be aided by the louver protrusions of the closed louvers of the aero-acoustic assembly experiencing reduced performance.

Through the various embodiments of an aero-acoustic assembly, the generation of aero-acoustics is minimized via articulation of intake louvers. The configuration of louvers allows for acoustic noise isolation as well as prevention of back pressure that can degrade performance when air is recirculated through vacuum pockets, such as in turbulent flow. The use of louvers allows a data storage enclosure to enjoy aero-acoustic optimization without the use of a static baffle that can occupy valuable enclosure space and reduce the volume of air that can be moved through the enclosure. The configuration of an aero-acoustic assembly provides flexibility of placement anywhere in a data storage enclosure, which can optimize the use of enclosure space and allow for additional data storage devices to be utilized.

It is to be understood that even though numerous characteristics and advantages of various embodiments of the present disclosure have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising an aero-acoustic assembly positioned within an enclosure, the aero-acoustic assembly comprising an intake occupied by a plurality of louvers, each respective louver of the plurality of louvers configured to move between an open louver position and a closed louver position in response to airflow passing through the intake, each respective louver of the plurality of louvers concurrently contacts a respective pressure feature of a plurality of pressure features, a keyed portion of the respective louver of the plurality of louvers, and a pressure tab extending from the enclosure, the keyed portion of the respective louver of the plurality of louvers occupying a keyed opening of the enclosure, each respective pressure feature of the plurality of pressure features continuously applying force towards the closed louver position.

2. The apparatus of claim 1, wherein the aero-acoustic assembly is one of a plurality of aero-acoustic assemblies mounted in the data storage enclosure.

3. The apparatus of claim 1, wherein the data storage enclosure comprises multiple aero-acoustic assemblies.

4. The apparatus of claim 1, wherein the aero-acoustic assembly comprises an air moving mechanism separated from the plurality of louvers by at least one tab.

5. The apparatus of claim 1, wherein the aero-acoustic assembly comprises a single housing onto which the plurality of louvers are mounted.

6. The apparatus of claim 1, wherein each respective louver of the plurality of louvers is independently articulable.

7. The apparatus of claim 1, wherein at least a portion of a louver of the plurality of louvers is padded with an acoustic noise reducing material.

8. A system comprising a baffle assembly and data storage device each mounted within a data storage enclosure, the baffle assembly comprising an intake occupied by a plurality of louvers, each respective louver of the plurality of louvers contacting a respective spring pressure feature of a plurality of spring pressure features and configured to move between an open louver position and a closed louver position in response to airflow passing through the intake, each respective spring pressure feature of the plurality of spring pressure features concurrently contacts a keyed portion of the respective louver of the plurality of louvers and a pressure tab extending from the enclosure, the keyed portion of the respective louver of the plurality of louvers occupying a keyed opening of the enclosure, each respective spring pressure feature of the plurality of spring pressure features continuously applying force towards the closed louver position.

9. The system of claim 8, wherein the data storage device is one of a plurality of data storage devices mounted in the data storage enclosure.

10. The system of claim 8, wherein the plurality of louvers block aero-acoustics from reaching the data storage device.

11. The system of claim 8, wherein the key opening restricts movement of the respective louver of the plurality of louvers outside of a predetermined angular range.

12. The system of claim 10, wherein each respective spring pressure feature of the plurality of spring pressure features independently exerts force onto the respective louver of the plurality of louvers.

13. The system of claim 10, wherein at least one louver of the plurality of louvers comprises a protrusion exterior to the intake that promotes laminar airflow when each respective louver of the plurality of louvers is in the closed louver position.

14. The system of claim 10, wherein the data storage enclosure comprises a keystone portion that restricts rotational movement of the plurality of louvers.

15. The system of claim 10, wherein each louver of the plurality of louvers have a matching cross-sectional L-shape.

16. A method comprising:
positioning an aero-acoustic assembly and a data storage device each within a data storage enclosure;
activating an air moving mechanism of the aero-acoustic assembly;
applying a continuous force onto at least one louver of a plurality of louvers of the aero-acoustic assembly towards a closed louver position with at least one spring pressure feature, the at least one spring pressure feature concurrently contacting a keyed portion of the at least one louver of the plurality of louvers and a pressure tab extending from the enclosure, the keyed portion of the at least one louver of the plurality of louvers occupying a keyed opening of the enclosure;
moving at least one of the plurality of louvers of the aero-acoustic assembly into an open louver position by overcoming the continuous force applied to the at least one louver of the plurality of louvers by the at least one spring pressure feature, the plurality of louvers occupying an intake of the aero-acoustic assembly;
experiencing degraded performance of the air moving mechanism reducing airflow through the intake; and
moving the plurality of louvers into the closed louver position to block airflow through the intake.

17. The method of claim 16, wherein the plurality of louvers block aero-acoustics generated by the air moving mechanism from reaching the data storage device.

18. The method of claim 16, wherein the plurality of louvers prevent back pressure from creating airflow turbulence in the data storage enclosure when in the closed louver position.

* * * * *